United States Patent
Gunther et al.

(10) Patent No.: US 9,369,124 B2
(45) Date of Patent: Jun. 14, 2016

(54) POWER-ON-RESET CIRCUIT WITH LOW POWER CONSUMPTION

(75) Inventors: Andre Gunther, San Jose, CA (US); Kevin Mahooti, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 903 days.

(21) Appl. No.: 13/082,142

(22) Filed: Apr. 7, 2011

(65) Prior Publication Data

US 2012/0256664 A1 Oct. 11, 2012

(51) Int. Cl.
*H03K 17/22* (2006.01)
*G06F 1/24* (2006.01)
*G06F 1/32* (2006.01)

(52) U.S. Cl.
CPC ............... *H03K 17/223* (2013.01); *G06F 1/24* (2013.01); *G06F 1/32* (2013.01)

(58) Field of Classification Search
CPC ............... H03K 17/08122; H03K 17/08128; H03K 2017/0806
USPC .......................................... 327/142, 143, 198
See application file for complete search history.

(56) References Cited

U.S. PATENT DOCUMENTS

| 5,369,310 A | 11/1994 | Badyal et al. |
| 5,587,866 A | 12/1996 | Yach et al. |
| 7,015,732 B1 * | 3/2006 | Holloway et al. ............. 327/143 |
| 7,711,971 B1 | 5/2010 | Jurgilewicz |

FOREIGN PATENT DOCUMENTS

| CN | 1757164 A | 4/2006 |
| WO | 97/49185 A1 | 12/1997 |
| WO | 2004/057449 A2 | 7/2004 |

OTHER PUBLICATIONS

Extended European Search Report for EP Patent Appln. No. 12163356.4 (Sep. 12, 2013).

* cited by examiner

*Primary Examiner* — John Poos

(57) ABSTRACT

Methods, devices and circuits are provided for power-on-reset circuits with low static power consumption. One such circuit includes a detector that draws current from a supply voltage. The detector detects that the supply voltage has exceeded a trip-point voltage level and then disables current draw from the detector. The detector responds to an enable signal by enabling current draw from the detector. A pulse generator generates a reset signal in response the supply voltage transitioning from a voltage below the trip point voltage level to above the trip point voltage level. A monitor detects that the supply voltage has dropped and provides, in response thereto, the enable signal to the detector to enable current draw from the portion of the detector.

18 Claims, 8 Drawing Sheets

POWER-ON-RESET CIRCUIT WITH LOW POWER CONSUMPTION

Aspects of the present disclosure are directed toward a power-on-reset circuit. In certain embodiments of the present disclosure, the power-on-reset circuit has low, or no, static power consumption.

Logic (such as synchronous logic of a microcontroller) often, if not always, needs to be initialized so that it is placed into a known state at power up and/or power down. To provide this initialization, a Power On Reset (POR) device can be used within circuits, such as a microcontroller with associated logic. The circuitry of the POR device generates a reset pulse that initializes the logic after the logic circuit's power supply ramps up. This reset pulse ensures that the logic starts in a known state, so that the startup of behavior of the circuit is predictable.

The power-on-reset circuit can function by monitoring the supply voltage and if the supply voltage transitions from a low state to a high state, generating a pulse. This pulse can be used to directly reset the synchronous logic or it can be combined with other reset sources, such as a brownout detector or various temper protection circuits.

Depending upon the application, problems with the POR can render the entire microchip inoperable. For instance, if the synchronous logic is not correctly initialized, the wakeup procedure for a circuit may never complete or may not even start. In other instances, an erroneous POR signal can cause the device to reset unnecessarily. Examples of erroneous POR signals include generating a reset signal when the power is still good or generating reset signals that have glitches or poor rise time (e.g., due to low drive strength).

POR circuits can consume both dynamic current and static current. The amount of dynamic current is closely linked to the circuit switching speed. Generally, the faster circuits switch, the more dynamic current that is drawn. Internal capacitors and transistor gain can be significant contributors to dynamic current, which is often proportional to switching frequency. The amount of static current is relatively constant over time and does not vary significantly as a function of switching frequency and/or clock speed; however, it can vary some based upon other factors such as temperature. Examples of sources of static current include leakage and bias current.

Aspects of the present disclosure recognize that dynamic current is negligible when the inputs to the system are relatively constant and do not switch. Thus, when the inputs are power supplies, the dynamic portions of the circuit do not draw much current during normal operation because power supplies only toggle when power is turned on and when it is turned off. Moreover, the relative time that a power supply is powering/ramping up or down is often small when compared to the time during which a stable supply voltage is provided. For instance, a supply voltage for an integrated chip may ramp up in microseconds and the integrated chip may run for milliseconds to days without the supply voltage being switch off. POR circuits can be designed without switching components during the active time of the logic circuitry (e.g., when the supply voltage is stable). The current draw of such POR circuits is primarily (or completely) from static current during the time that the supply voltage is stable.

Aspects of the present disclosure also recognize that it can be advantageous to achieve a fast response/speed for a POR circuit. The response/speed of the POR circuit can be increased be providing additional current during power on and/or power down (e.g., to charge (parasitic) capacitors at a faster rate). Consistent with embodiments of the present disclosure, this high-level of current draw can be disabled during normal operation (e.g., when the supply voltage is stable). In this manner, the current draw is present only during the relatively short time that corresponds to a power up or power down of the system. To provide additional current for the circuit, the bias current can be increased, which means that the static current will also increase. By disabling the static current, greater speed and accuracy can be obtained without increasing the overall current draw, which includes the current draw when the supply voltage is stable.

Consistent with one embodiment of the present disclosure, a power-on-circuit includes a supply voltage detector that includes circuit elements that are powered by a supply voltage. The supply voltage detector is configured to detect that the supply voltage has exceeded a trip point voltage level and to disable current draw from the circuit elements in response to detecting that the supply voltage exceed the trip point voltage level. A power-on-reset pulse generator is configured to generate a power-on-reset signal in response the supply voltage transitioning from a voltage below the trip point voltage level to a voltage above the trip point voltage level. A supply voltage drop detector is configured to detect a drop in the supply voltage and to provide, in response to detecting the drop in the supply voltage, an enable signal to the supply voltage detector that enables current draw from the circuit elements.

Consistent with one embodiment of the present disclosure, a circuit is provided for use with circuitry that is reset by a power-on reset signal that is provided in response to power being provided. The circuit comprises a detector that includes a portion that is configured to draw current from a supply voltage. The detector is configured to detect that the supply voltage has exceeded a trip-point voltage level. The detector is also configured to disable, in response to detecting that the supply voltage exceeds the trip point voltage level, current draw from the portion of the detector, and to enable, in response to an enable signal, current draw from the portion of the detector. A pulse generator is configured to generate a reset signal in response to the supply voltage transitioning from a voltage below the trip point voltage level to above the trip point voltage level. A monitor is configured to detect that the supply voltage has dropped and to provide, in response to detecting the supply voltage has dropped, the enable signal to the detector to enable current draw from the portion of the detector.

According to other embodiments of the present disclosure a method is provided for use with circuitry that is reset by a power-on reset signal that is provided in response to power being provided. The method comprises detecting, using a detector, that the supply voltage has exceeded a trip-point voltage level. The method also includes disabling, in response to detecting that the supply voltage exceeds the trip point voltage level, current draw from the portion of the detector, and enabling, in response to an enable signal, current draw from the portion of the detector. A pulse generator is used to generate a reset signal in response to the supply voltage transitioning from a voltage below the trip point voltage level to above the trip point voltage level. A monitor is used to detect that the supply voltage has dropped. In response to detecting the supply voltage has dropped, the enable signal is provided to the detector to enable current draw from the portion of the detector.

The above discussion is not intended to describe each embodiment or every implementation. The figures and following description also explicitly describe various embodiments and other embodiments, modifications, equivalents, and alternatives that fall within the spirit and scope of the disclosure.

Various example embodiments may be more completely understood in consideration of the following detailed description in connection with the accompanying drawings, in which.

Figure 1:
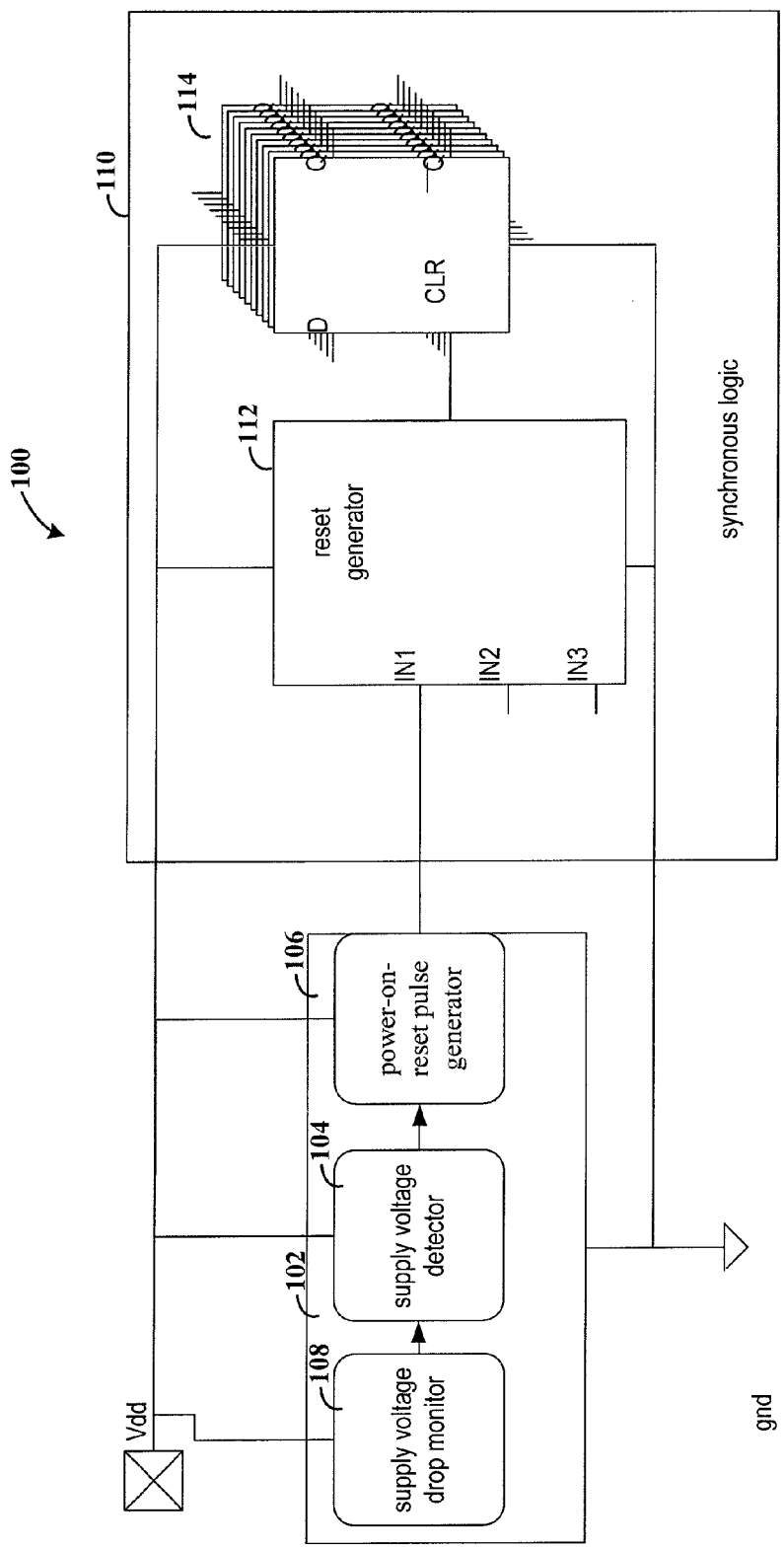
FIG. 1 depicts a block diagram of a system that includes a POR circuit, consistent with embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

One or more of the various disclosed embodiments are applicable to a variety of different types of Power On Reset (POR) circuits, devices, methods and arrangements for use with various different systems and devices. While the embodiments are not necessarily so limited, various aspects of the disclosure may be appreciated through a discussion of examples using this context.

Advanced power management modes and low power standby states can be effective to reduce the power consumption of devices. The POR circuit's power consumption can be a major contributor to the system power consumption in standby and low power mode. Aspects of the present disclosure recognize that keeping the power consumption very low can be useful for extending the battery life of mobile applications and for improving the energy efficiency of a device, such as a microchip.

Consistent with an embodiment of the present disclosure, a POR circuit is provided that has virtually no static current draw during normal operation. Accordingly, while there is very little current draw, there may still be insignificant current from inherent imperfections of the circuit, e.g., from leakage current and/or parasitic current paths due to the specific implementation.

Aspects of the present disclosure recognize that design considerations for POR circuits can require accurate monitor circuits, which can draw significant current during monitoring. Thus, continuous monitoring of the supply voltage using such accurate monitor circuits can result in a noticeable current draw from the supply voltage. For instance, POR circuits can include one or more voltage reference generators, voltage dividers and comparators, each powered by the supply voltage. These components can be used to provide the set and reset functions of the POR signal. For instance, a POR device can be configured to deliver a reset pulse at a first trip point, but will not deliver another reset pulse before the POR device is set (e.g., in response to the supply voltage dropping). The reset pulse is asserted at a lower trip point compared to the de-assertion trip point. This difference in trip points creates a hysteresis, which can be useful for preventing unintended oscillations. In this manner, the set-comparator will provide the POR-pulse signal when the supply drops below its threshold and the reset-comparator will release the POR-pulse signal when the supply rises above its threshold (after a defined pulse duration). These circuits, however, can have a static current draw that can be detrimental to the overall power consumption of the device.

Noise immunity and speed determine a lower limit of this current consumption I for such components. Application, technology and voltage levels are two factors that are relevant to the current level I. A designer that has very limited control over these factors has to design the circuit with a minimum current required to ensure that the speed and noise immunity requirements are met. The current (I) needed to charge the parasitic capacitors within a given time frame (t) are proportional to the parasitic capacitance value ($C_p$) and the trip voltage ($V_{trip}$)

$$t = \frac{V_{trip} \times C_P}{I}$$

where $V_{trip}$ is determined by the supply voltage at the time of trip, the (S-R latch) design and the manufacturing process. Often, the designer can only influence the trip voltage to a very small degree, which results in a required current (I) being high enough to negatively affect current draw.

Another consideration is parasitic capacitances. Parasitic capacitances are generally layout and technology dependent. In a given technology, some amount of parasitic capacitance is always present. Moreover, reducing the parasitic capacitance may actually increase the trip voltage, resulting in a net reduction in speed.

For at least these reasons, aspects of the present disclosure recognize that a designer's main mechanism for achieving a desired time frame is often limited to increasing the current consumption. The maximum permissible detection delay thus influences the current consumption in a direct fashion, and a POR with a low current consumption is not suited for detecting very fast supply spikes. This can limit the power consumption of the POR circuit to a minimum value, which is required to guarantee detection of a minimum duration pulse specified in the system design. The designer would likely also account for technology and temperature variations in order to meet the specification under worst-case conditions, which can raise the minimum current requirements even further.

Embodiments of the present disclosure can be particularly useful for circumventing the aforementioned speed/power trade-off. Various embodiments are directed toward a POR circuit that dynamically turns off after the supply rises above the de-assertion detection threshold. The POR circuit then turns itself back on in response to a falling supply voltage. The POR circuit can then detect an under-voltage condition. Accordingly, limitations on current consumption can be alleviated or removed when they would otherwise be present, e.g., if the POR circuit maintained a non-negligible static current draw during normal operation. In particular embodiments, the current consumption is negligible or effectively zero when the POR circuit is turned off (recognizing that there can be insubstantial sources of current draw such as from leakage current or parasitic current paths).

Embodiments of the present disclosure can be particularly useful for facilitating the use of higher current during the detection (rising and falling supply). This can result in faster detection. Being able to use more current during this period can also be useful for allowing the use of more sophisticated voltage references, resulting in better control over the detection level.

Consistent with embodiments of the present disclosure, a POR circuit is configured to turn off components with a static current in response to detecting the initial power-up ramp. For instance, a power good signal (e.g., from an S-R flip-flop) can be used to disable power to the components with static current.

Embodiments of the present disclosure relate to the use of a supply voltage monitor that detects when the supply voltage drops a certain amount. This supply voltage monitor circuit need not be as accurate as the comparator circuit, which allows the supply voltage monitor to be configured so that it does not consume static current. In response to detecting a voltage drop of the supply voltage, the supply voltage monitor can turn on the POR components that have a static current. This results in the enablement of elements, such as comparators and reference circuits, which allow the POR circuit to detect whether the supply voltage falls below the negative trip-point of the comparator. The activated circuits can draw more current, which allows for them to be configured with more accuracy and/or reliability than the supply voltage monitor circuit. This negative trip-point can be set to value that is less than a positive trip point. The difference between these trip points can be referred to as the hysteresis value of the POR circuit.

Turning now to the figures, FIG. 1 depicts a block diagram of a system that includes a POR circuit, consistent with embodiments of the present disclosure. The system 100 includes synchronous logic 110. Synchronous logic 110 includes a reset generating circuit 112. Reset generating circuit 112 provides a reset signal to synchronous components 114. This reset signal places synchronous components 114 into a known state. Although depicted as flip-flops, synchronous logic 114 can be various other types of logic and can include asynchronous logic. Reset generating circuit 112 can be synchronous or asynchronous.

Synchronous logic 114 is powered by a supply voltage Vdd. The state of synchronous logic 114 cannot be guaranteed upon first being provided with supply voltage Vdd or when supply voltage Vdd drops below a minimum voltage level. Accordingly, POR circuit 102 includes a POR pulse generator circuit 106 that provides a reset signal to the reset generator 112 based upon the voltage of supply voltage Vdd. A first (positive) supply voltage detector 104 detects when the supply voltage Vdd rises above a positive trip-point. When this occurs two things happen. First, a reset signal is provided to reset generator 112 to reset synchronous logic 114. Second, components with a static current are disabled. This allows the POR circuit 102 to have effectively no static current after the supply voltage Vdd reaches the trip point and synchronous logic 114 has been reset to a known state.

A supply voltage drop detector 108 is also present. The supply voltage drop detector 108 is also referred to as a negative slope detection circuit. Aspects of the present disclosure recognize that the POR circuit 102 should be able to monitor the supply voltage Vdd to detect when it is below a negative trip-point/threshold voltage. Rather than continuously monitor using components with a static current draw, the negative slope detection circuit 108 can detect when Vdd drops a certain amount. In certain embodiments, the negative slope detection circuit 108 has no static current draw when Vdd remains constant. When the supply voltage drop detector 108 detects a drop in Vdd it enables the supply voltage detector 104. Supply voltage detector 104 then monitors Vdd to determine if Vdd drops below the negative trip-point. If this occurs, then the POR reset generator 106 provides a reset signal to the reset generator 112.

Figure 2:
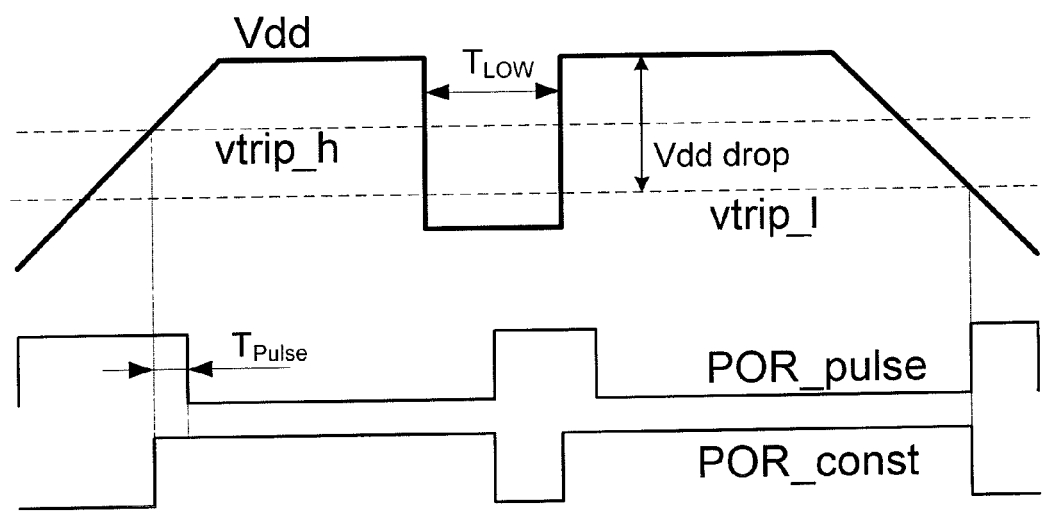
FIG. 2 depicts voltage waveforms for a POR circuit, consistent with embodiments of the present disclosure.

FIG. 2 depicts voltage wave forms for a POR circuit, consistent with embodiments of the present disclosure. The POR circuit uses a fast differential reference to accurately control the rising edge trip level (vrtip_h). The differential reference ensures that this vtrip_h level does not exceed a set value while maintaining a tight voltage level control to ensure proper reset of logic circuits. The use of this differential reference also permits fast startup of the POR. After the circuit detects the trip point and toggles its outputs, it will cease to generate the differential reference and can also disable the reference comparator to stop static current drawn by these elements. A zero-static-power detector will re-enable the comparator and reference when the supply voltage drops by a threshold (Vdd_drop).

The Tpulse arrow represents the length of time for maintaining the POR signal (POR_pulse) after the supply voltage has reached the rising edge trip level. The POR_const signal represents the output of the comparator and shows the delay between detecting a trip point and release of the POR_pulse signal.

The detection threshold for the supply voltage drop (Vdd_drop) is determined based upon a voltage drop from the highest level of the supply voltage. The highest level of the supply voltage does not necessarily represent the highest voltage of short voltage spikes because the level is subject to charging delays of the capacitor. In certain embodiments, a passive filter can precede the drop detector, in order to eliminate detection of very fast and very large negative voltage spikes. The filter size is small enough to prevent the excessive low time requirement of other POR circuits that makes a fast power down/power up sequence impossible while maintaining sufficient noise isolation.

According to an example embodiment of the present disclosure, the power supply voltage can be valid at voltages of 1.2V-3.6V. The reference for vrtip_h ensures that the trip level does not exceed 12V while maintaining a tight voltage level control to ensure proper reset of logic circuits. The negative trip point can lie between 0.6V and 1.2V.

Figure 3:
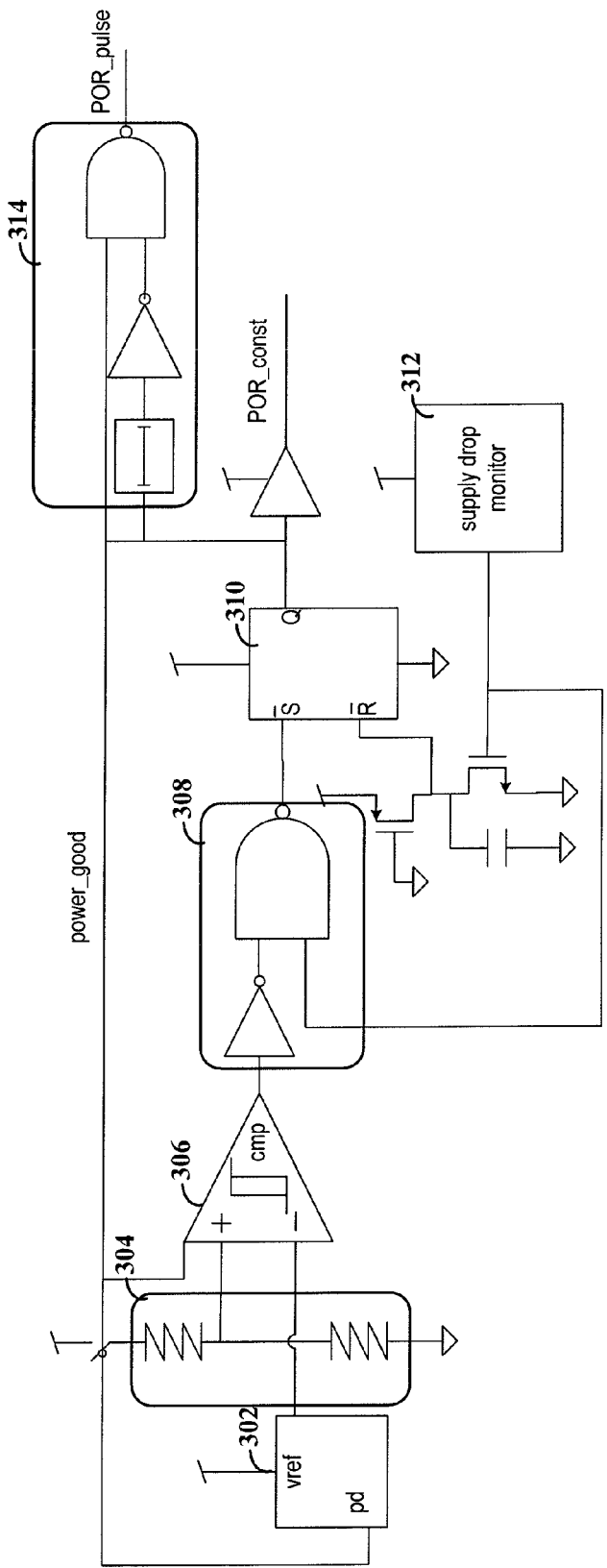
FIG. 3 depicts a circuit diagram of a POR circuit, consistent with embodiments of the present disclosure.

FIG. 3 depicts a circuit diagram of a POR circuit, consistent with embodiments of the present disclosure. Reference generator 302 generates a reference voltage. In certain embodiments of the present disclosure, this reference voltage can be a fixed value (e.g., using a voltage regulator) or a voltage that is a non-linear function of the supply voltage. Examples of such embodiments are discussed in more detail in connection with FIG. 5. Voltage divider network 304 produces another reference voltage that is a linear function of the supply voltage. In certain embodiments of the present disclosure, this other reference can be a non-linear function of the supply voltage.

Comparator 306 compares the reference voltages and provides an output to logic circuitry 308. Logic circuitry 308 generates an output to set SR latch 310. The output of SR latch 310 represents that the power is good (POR_const). The associated pd signal disables current draw from the reference generators 302 and the voltage divider network 304. This signal is then reset in response to the supply drop monitor 312 detecting when the supply voltage drops. Logic circuitry 314 generates a POR_pulse that is maintained for a time period after the output of the SR latch indicates that the power is good. Supply drop monitor 312 detects when the supply voltage drops a certain amount from its previous high voltage point. In response to this detection, the SR latch 310 is reset.

This allows the generation of a new POR_pulse in response to the output of the logic circuitry 308.

Figure 4:
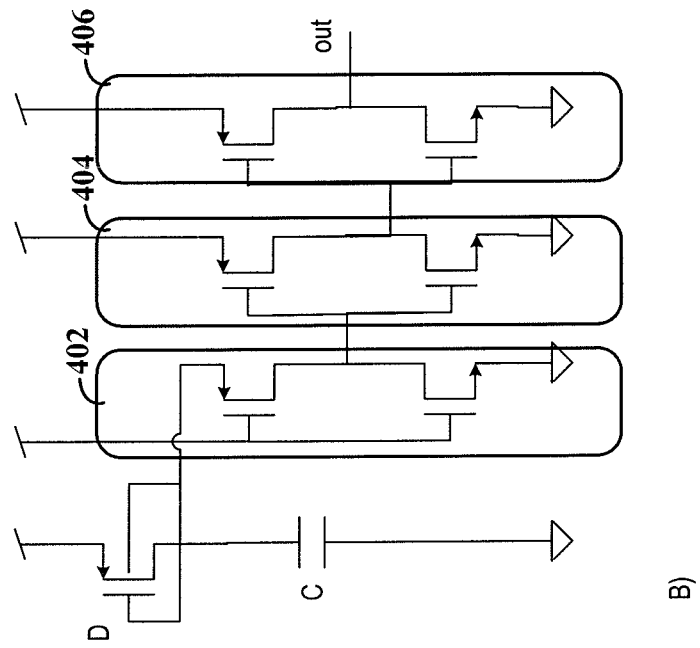
FIG. 4 depicts circuit diagrams for a supply drop monitor, consistent with embodiments of the present disclosure.
Figure 4:
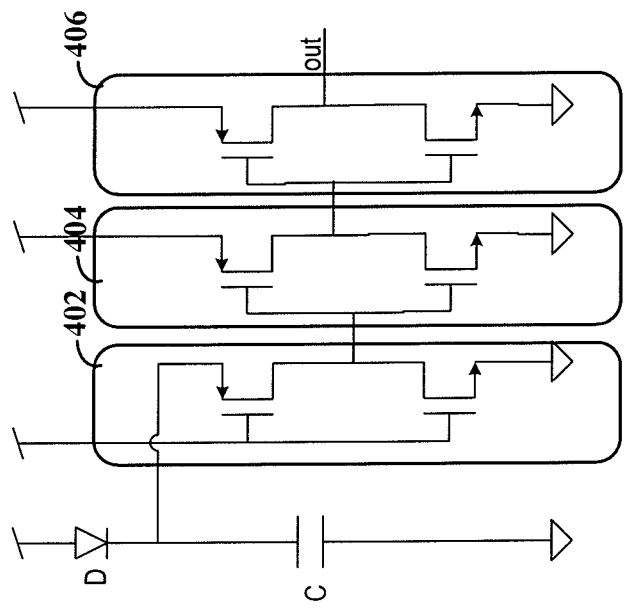

FIG. 4 depicts a circuit diagram for a supply drop monitor, consistent with embodiments of the present disclosure. FIG. 4 depicts two possible implementations of a supply voltage drop detector. When the supply voltage (Vdd) rises to its steady-state value, the capacitor (C) will charge up and eventually reach the steady-state value of the supply voltage. As Vdd drops, the diode (circuit diagram A) or a transistor (circuit diagram B) with its gate and n-well connected to its drain will prevent the capacitor voltage from discharging through the Vdd net. Accordingly, the capacitor will stay charged up to the maximum supply voltage.

The supply drop monitor includes an inverter 402, which can be constructed from transistors. The supply voltage of the inverter comes from the capacitor (C) and the supply voltage of the POR drives the input of this inverter. The inverter thus serves to detect a negative slope of the supply voltage. When the supply voltage falls below the trip point of this detector, the detector output voltage will change from low to high. The inverter 402 has low drive strength due to its supply voltage coming from the diode/capacitor connection. The supply current of the detector limits the detection level of the supply detector during very slow negative voltage ramps. The next two inverters (404 and 406) provide buffering that improves the output drive strength of the detector.

Figure 5:
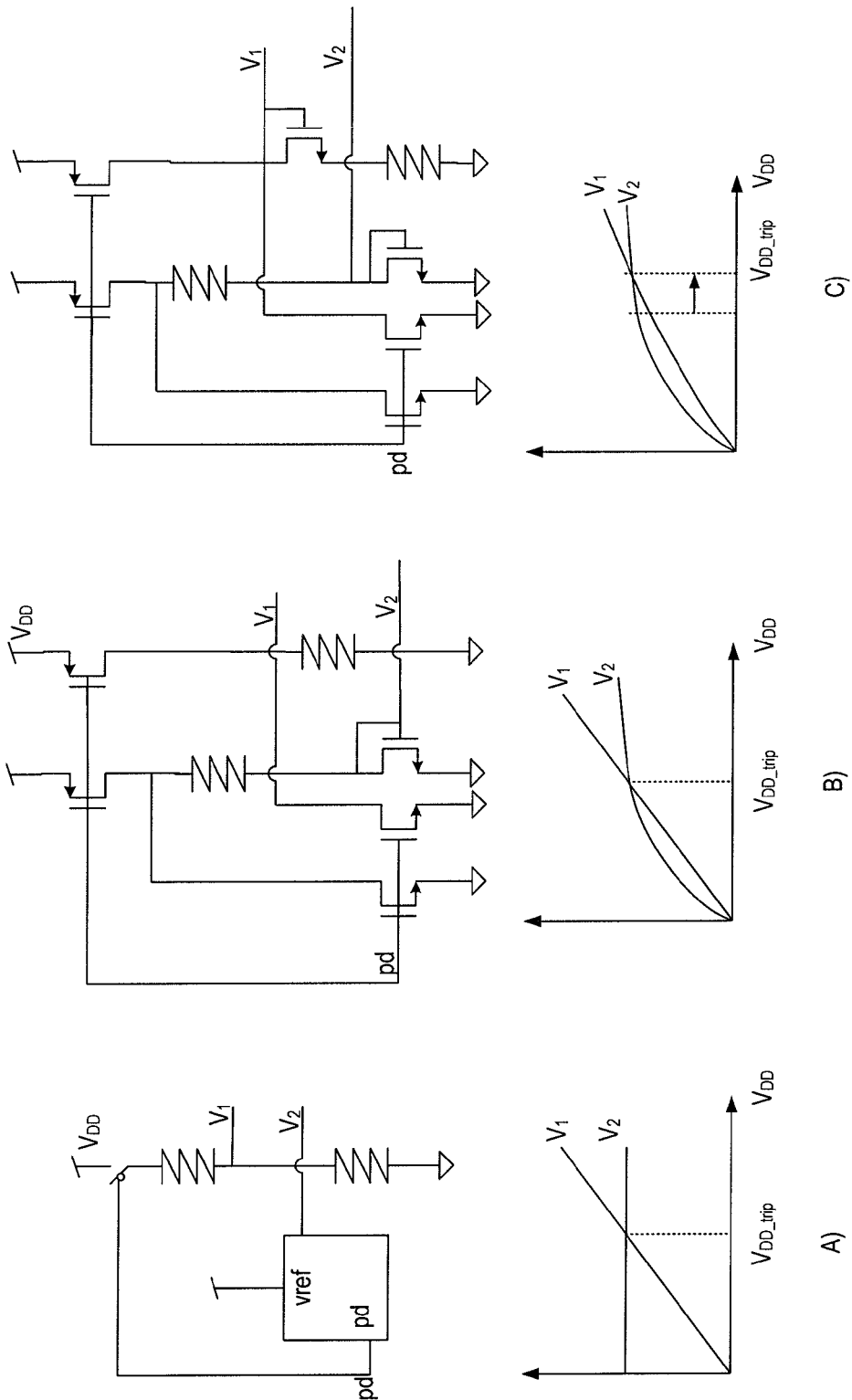
FIG. 5 depicts circuit diagrams for reference voltage generators and corresponding voltage diagrams, consistent with embodiments of the present disclosure.

FIG. 5 depicts circuit diagrams for reference voltage generators and corresponding voltage diagrams, consistent with embodiments of the present disclosure. Depending on the desired trip point of the POR, the voltage reference design and the comparator can vary. The voltage reference and voltage divider combination can also be replaced with a differential reference generator, designed to have an intercept point (when $V_1$ and $V_2$ are equal) that corresponds to a pre-determined supply voltage.

Circuit and voltage diagrams A) show reference generators based upon a reference voltage and a resistor ladder. The $V_1$ reference generator provides an output that is a linear function of the supply voltage (Vdd). The $V_2$ reference generator provides a constant voltage.

Circuit and voltage diagrams B) show reference generators based upon a biased gate to source voltage (VGS) and a biased resistor. This implementation of differential voltage reference generators produces a (semi-)linear voltage $V_1$ and a nonlinear voltage $V_2$. The intercept point between the voltages can be adjusted through appropriate sizing of the devices.

Circuit and voltage diagrams C) show reference generators based upon a VGS and a resistor-linearized VGS of a larger transistor. This implementation of differential voltage references includes two nonlinear voltages. This implementation allows for the adjustment of the intercept point toward larger supply voltages as compared to the reference in B).

The circuits of FIG. 5 provide a few possibilities for reference voltage generators. Aspects of the present disclosure recognize that a large variety of voltage reference and/or divider architectures can be used. For instance, because the power consumption of the reference is only relevant for periods when the POR circuit is active, the overall power consumption remains low even when the power consumption is increased during the active time of the POR circuit.

Figure 6:
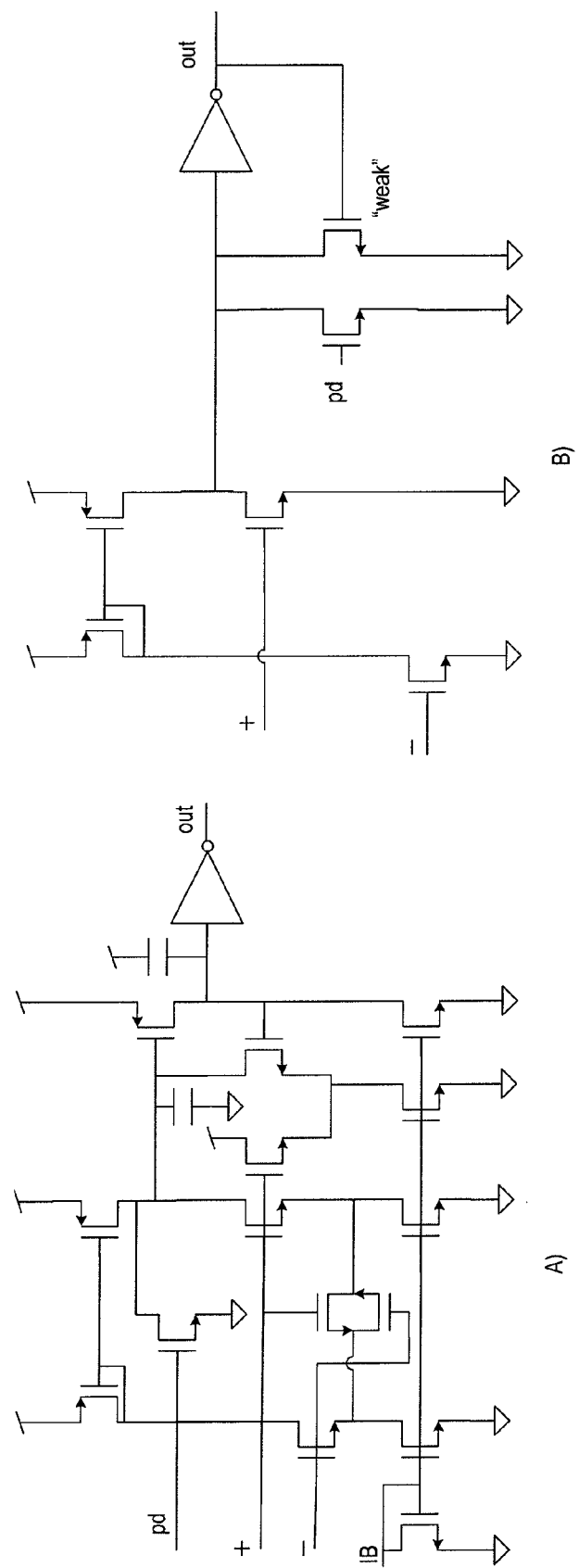
FIG. 6 depicts a circuit diagram for a comparator, consistent with embodiments of the present disclosure.

FIG. 6 depicts a circuit diagram for a comparator, consistent with embodiments of the present disclosure. Both comparators have hysteresis to achieve noise immunity of the reset generation. Circuit diagram A) shows a design for a differential comparator with hysteresis and transconductance linearization (IB=0 during pd). This comparator uses a bias current. In certain implementations, the bias current can be derived from the circuits of FIG. 5.

Circuit diagram B) shows a design for a low voltage comparator with feedback. Current biased comparators have well controlled power consumption, but require a larger input common mode voltage. Accordingly, the comparator of B) can be particularly useful for power-on-reset circuits with low trip points, e.g., the comparator can operate with a minimum supply voltage of VGS+VDS.

Aspects of the present disclosure recognize that other comparator architectures can be used in the POR circuit.

Figure 7:
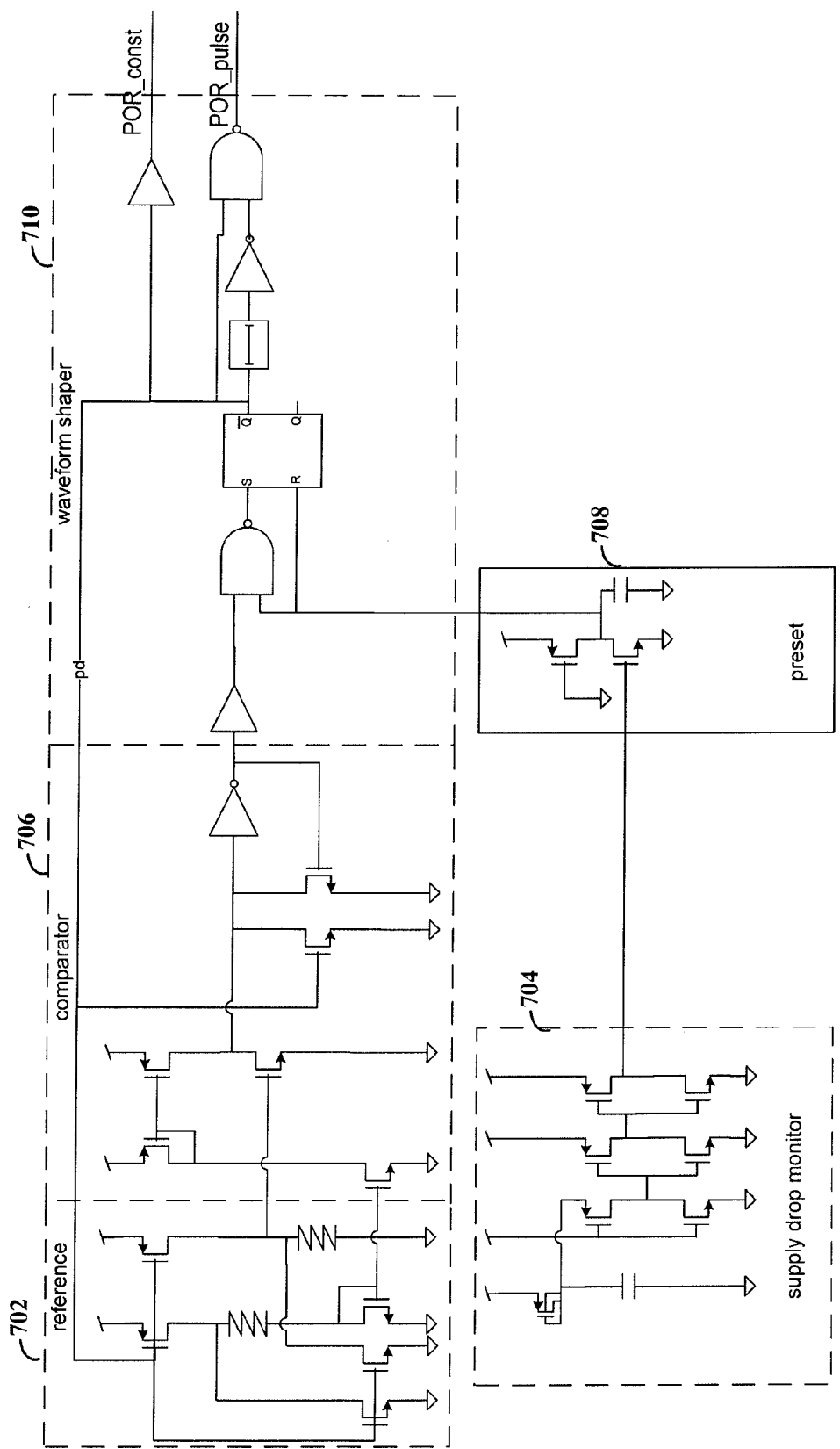
FIG. 7 depicts a circuit diagram for a POR circuit, consistent with embodiments of the present disclosure.

FIG. 7 depicts a circuit diagram for a POR circuit, consistent with embodiments of the present disclosure. The circuit diagram is generally consistent with the components of FIGS. 4-6. This POR circuit uses the low voltage comparator and low-voltage reference circuits. Accordingly, this POR circuit can be particularly useful for systems that benefit from having very low trip points.

For instance, reference generator 702 provides two reference voltages to comparator 706. One voltage of the reference generator is a semi-linear voltage and the other is a nonlinear voltage (relative to Vdd). The intercept point between the voltages can be adjusted through appropriate sizing of the devices. Comparator 706 is a low voltage comparator with feedback and hysteresis. In response to the reference voltages crossing each other (as may be offset by the hysteresis value), the output of comparator 706 changes and sets the SR latch of waveform shaper 710.

Supply drop monitor 704 detects a voltage drop of the supply voltage Vdd. In response, supply drop monitor 704 provides a signal to preset 708. Preset 708 resets the SR latch of waveform shaper 710.

Waveform shaper 710 generates the pd signal that determines whether or not the reference generator 702 and comparator 706 are enabled/draw current. Waveform shaper 710 also generates a POR const signal that represents that the power is above a minimum threshold. Additionally, waveform shaper 710 generates a POR_pulse that can be used to reset various components of the system.

Figure 8:
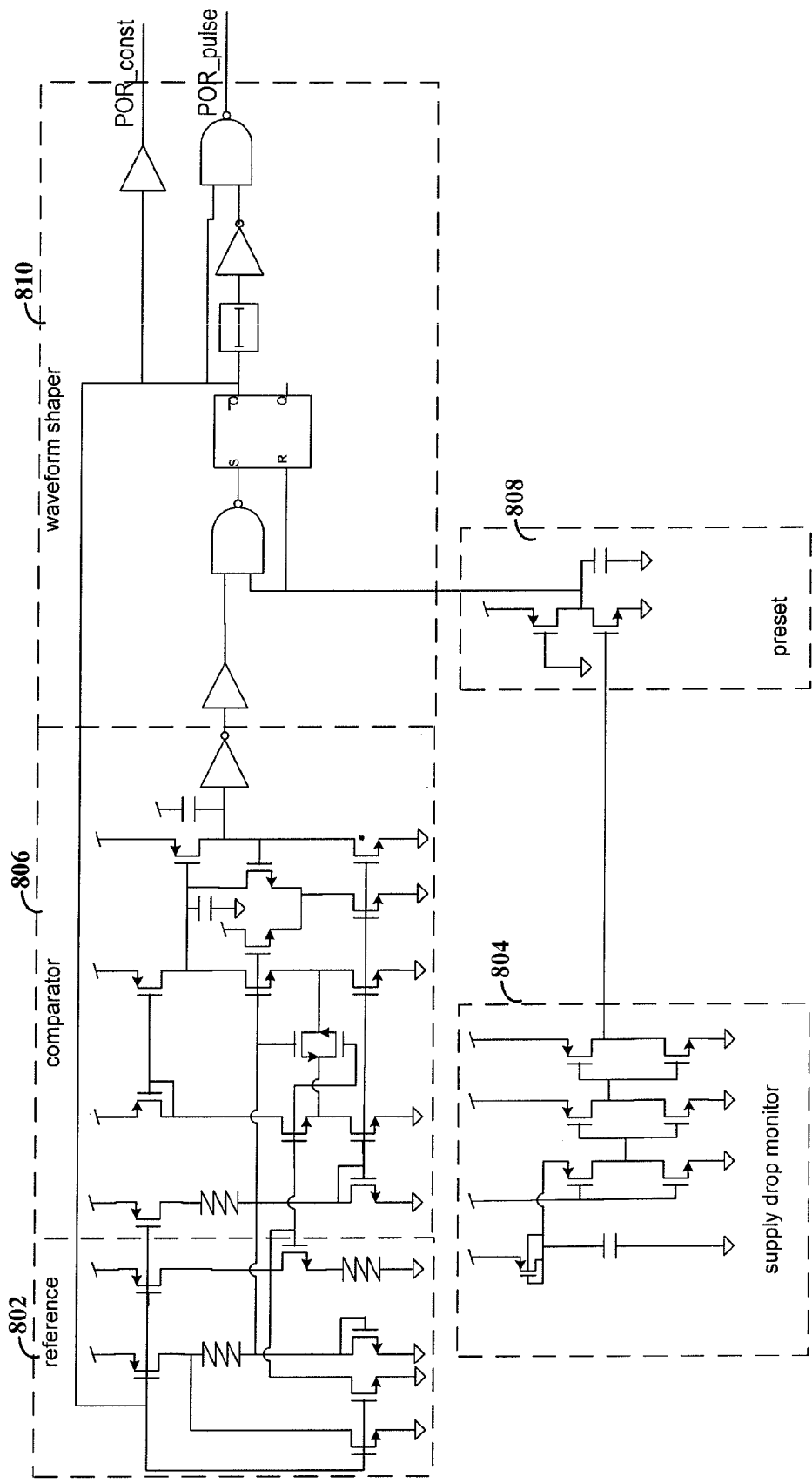
FIG. 8 depicts a circuit diagram for POR circuit, consistent with embodiments of the present disclosure.

FIG. 8 depicts a circuit diagram for POR circuit, consistent with embodiments of the present disclosure. The POR circuit of FIG. 8 can be particularly useful for systems in which higher trip points are desired. Higher trip points can be useful to monitor systems that use voltage supplies with a high nominal/steady state voltage. For instance, the reference voltage generator 802 generates reference voltages that are each non-linear representations of the supply voltage Vdd. The comparator 806 shows a design for a differential comparator that uses a bias current and provides with hysteresis, transconductance linearization and shutdown (IB=0 during pd). The supply drop monitor 804, preset 808 and waveform shaper 810 provide functionality similar to that described in connection with FIG. 7.

Embodiments of the present disclosure recognize that power consumption of circuits can be an important consideration for many advanced power management modes and low power standby states have reduced the power consumption of recent microchips significantly. This also requires the POR circuit's power consumption to be minimal, to minimize its impact on the overall system power consumption. Keeping the power consumption very low can be useful for extending the battery life of mobile applications and for improving the energy efficiency of the microchip.

Based upon the above discussion and illustrations, those skilled in the art will readily recognize that various modifications and changes may be made without strictly following the exemplary embodiments and applications illustrated and described herein. For example, the specific comparators, buffers and reference generators are provided by way of example and are not necessarily limiting. Such modifications do not depart from the true spirit and scope of the present disclosure, including that set forth in the following claims.

What is claimed is:

1. For use with circuitry that is reset by a power-on reset signal that is provided in response to power being provided, a circuit comprising:
   a detector that includes a portion that is configured to draw current from a supply voltage, the detector configured to detect that the supply voltage has exceeded a trip-point voltage level,
      disable, in response to detecting that the supply voltage exceeds the trip point voltage level, current draw from the portion of the detector, and
      enable, in response to an enable signal, current draw from the portion of the detector;
   a pulse generator configured to generate a reset signal in response to the supply voltage transitioning from a voltage below the trip point voltage level to above the trip point voltage level; and
   a monitor configured to detect that the supply voltage has dropped and to provide, in response to detecting the supply voltage has dropped, the enable signal to the detector to enable current draw from the portion of the detector.

2. The circuit of claim 1, wherein the monitor does not draw current during steady state operation in which the supply voltage is constant.

3. The circuit of claim 1, wherein the monitor stores the supply voltage on a capacitive element and detects that the supply voltage has dropped below the stored supply voltage by a threshold amount.

4. The circuit of claim 1, wherein the monitor includes a voltage reference generating component powered by the supply voltage and a switch element that disconnects the supply voltage from the voltage reference generating circuit in response to the detector detecting that the supply voltage exceeds the reference voltage level.

5. The circuit of claim 1, wherein the monitor includes a first voltage reference generator that generates a first reference voltage that is a semi-linear version of the supply voltage and includes a second voltage reference generator that generates a nonlinear version of the supply voltage and wherein the detector compares the reference voltages from the first and second voltage reference generators to detect that the supply voltage exceeds the trip point voltage level.

6. The circuit of claim 1, wherein the detector includes a first voltage reference generator that generates a first reference voltage that is a nonlinear version of the supply voltage according to a first function and includes a second voltage reference generator that generates a nonlinear version of the supply voltage according to a second function that is different from the first function and wherein the detector compares the reference voltages from the first and second voltage reference generators to detect that the supply voltage exceeds the trip point voltage level.

7. The circuit of claim 1, wherein the detector includes a comparator with hysteresis, transconductance linearization and shutdown.

8. The circuit of claim 1, wherein the detector includes a comparator that includes a positive feedback element.

9. The circuit of claim 1, wherein the portion that is configured to draw current from a supply voltage includes a reference voltage generator and a comparator.

10. For use with circuitry that is reset by a power-on reset signal that is provided in response to power being provided, a method comprising:
   detecting, using a detector, that the supply voltage has exceeded a trip-point voltage level,
   disabling, in response to detecting that the supply voltage exceeds the trip point voltage level, current draw from the portion of the detector, and
   enabling, in response to an enable signal, current draw from the portion of the detector;
   generating, using a pulse generator, a reset signal in response the supply voltage transitioning from a voltage below the trip point voltage level to above the trip point voltage level;
   detecting, using a monitor, that the supply voltage has dropped; and
   providing, in response to detecting the supply voltage has dropped, the enable signal to the detector to enable current draw from the portion of the detector.

11. The method of claim 10, wherein the monitor does not draw current during steady state operation in which the supply voltage is constant.

12. The method of claim 10, further including charging, using the supply voltage, a capacitive element within the monitor and detecting that the supply voltage drops below stored supply voltage by a threshold amount.

13. The method of claim 10, further including generating a reference voltage using a generating component powered by the supply voltage and using a switch element to disconnect the supply voltage from the voltage reference generating circuit in response to the detector detecting that the supply voltage exceeds the reference voltage level.

14. The method of claim 10, further including
   generating, using a first voltage reference generator, a first reference voltage that is a semi-linear version of the supply voltage;
   generating, using a second voltage reference generator, a nonlinear version of the supply voltage; and
   comparing the reference voltages from the first and second voltage reference generators to detect that the supply voltage exceeds the trip point voltage level.

15. The method of claim 10,
   generating, using a first voltage reference generator, a first reference voltage that is a nonlinear version of the supply voltage;
   generating, using a second voltage reference generator, a nonlinear version of the supply voltage; and
   comparing the reference voltages from the first and second voltage reference generators to detect that the supply voltage exceeds the trip point voltage level.

16. The method of claim 10, further including providing a hysteresis and transconductance linearization with the comparator.

17. The method of claim 10, further including using a positive feedback element within the detector.

18. The method of claim 10, wherein the portion that is configured to draw current from a supply voltage includes a reference voltage generator and a comparator.

* * * * *